(12) United States Patent
Oliver et al.

(10) Patent No.: US 10,631,407 B1
(45) Date of Patent: Apr. 21, 2020

(54) CIRCUIT BOARD WITH NON-PLATED HOLE INTERPOSED BETWEEN PLATED HOLES TO PREVENT FORMATION OF CONDUCTIVE ANODIC FILAMENT

(71) Applicant: CISCO TECHNOLOGY, INC., San Jose, CA (US)

(72) Inventors: Jennifer Oliver, San Jose, CA (US); Ashok Kumar Singh, San Jose, CA (US); Musan Hu, Cupertino, CA (US); David Senk, Spencer, TN (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/453,235

(22) Filed: Jun. 26, 2019

(51) Int. Cl.
*H05K 1/11* (2006.01)
*H05K 1/03* (2006.01)

(52) U.S. Cl.
CPC ........... *H05K 1/116* (2013.01); *H05K 1/0366* (2013.01); *H05K 1/112* (2013.01); *H05K 2201/029* (2013.01); *H05K 2201/0769* (2013.01); *H05K 2201/09063* (2013.01); *H05K 2201/09609* (2013.01); *H05K 2201/09636* (2013.01)

(58) Field of Classification Search
CPC ...................................................... H05K 1/116
USPC ........................................................ 174/262
See application file for complete search history.

(56) References Cited

U.S. PATENT DOCUMENTS

| | | | |
|---|---|---|---|
| 7,173,193 B2 | 2/2007 | Brodsky | |
| 7,633,766 B2 | 12/2009 | Regnier | |
| 7,830,223 B2 | 11/2010 | Ahmad | |
| 2003/0070931 A1* | 4/2003 | Kitchens | B32B 7/08 205/118 |
| 2006/0185890 A1* | 8/2006 | Robinson | H05K 1/0216 174/255 |
| 2006/0245709 A1* | 11/2006 | Frenkel | B82Y 20/00 385/129 |
| 2008/0073113 A1 | 3/2008 | Senk | |
| 2008/0185180 A1 | 8/2008 | Cheng | |
| 2009/0149334 A1* | 6/2009 | Waterbury | G01N 27/226 506/7 |
| 2010/0193229 A1* | 8/2010 | Zhang | H05K 3/0055 174/260 |
| 2010/0244871 A1 | 9/2010 | Blair | |
| 2016/0150645 A1* | 5/2016 | Gailus | H05K 1/0219 174/266 |

* cited by examiner

*Primary Examiner* — Stanley Tso
(74) *Attorney, Agent, or Firm* — Cindy Kaplan

(57) ABSTRACT

In one embodiment, an apparatus includes a plurality of layers in a circuit board, each of the layers comprising a fiber weave, two plated holes extending through the layers and connecting two or more of the layers, and a non-plated hole interposed between the plated holes. The non-plated hole passes through a potential CAF (Conductive Anodic Filament) migration path along the fiber weave to prevent CAF formation between the plated holes.

17 Claims, 6 Drawing Sheets

US 10,631,407 B1

CIRCUIT BOARD WITH NON-PLATED HOLE INTERPOSED BETWEEN PLATED HOLES TO PREVENT FORMATION OF CONDUCTIVE ANODIC FILAMENT

TECHNICAL FIELD

The present disclosure relates generally to electronic components, and more specifically, to preventing Conductive Anodic Filament (CAF) formation in printed circuit boards.

BACKGROUND

Printed Circuit Boards (PCBs) are used in a wide variety of electrical devices. PCBs include multiple layers of conductors, which are interconnected by metallized holes, referred to as plated holes. As the circuit density on printed circuit boards increases, plated holes become more closely spaced and the risk of failure due to CAF increases.

BRIEF DESCRIPTION OF THE FIGURES

Corresponding reference characters indicate corresponding parts throughout the several views of the drawings.

DESCRIPTION OF EXAMPLE EMBODIMENTS

Overview

Figure 1:
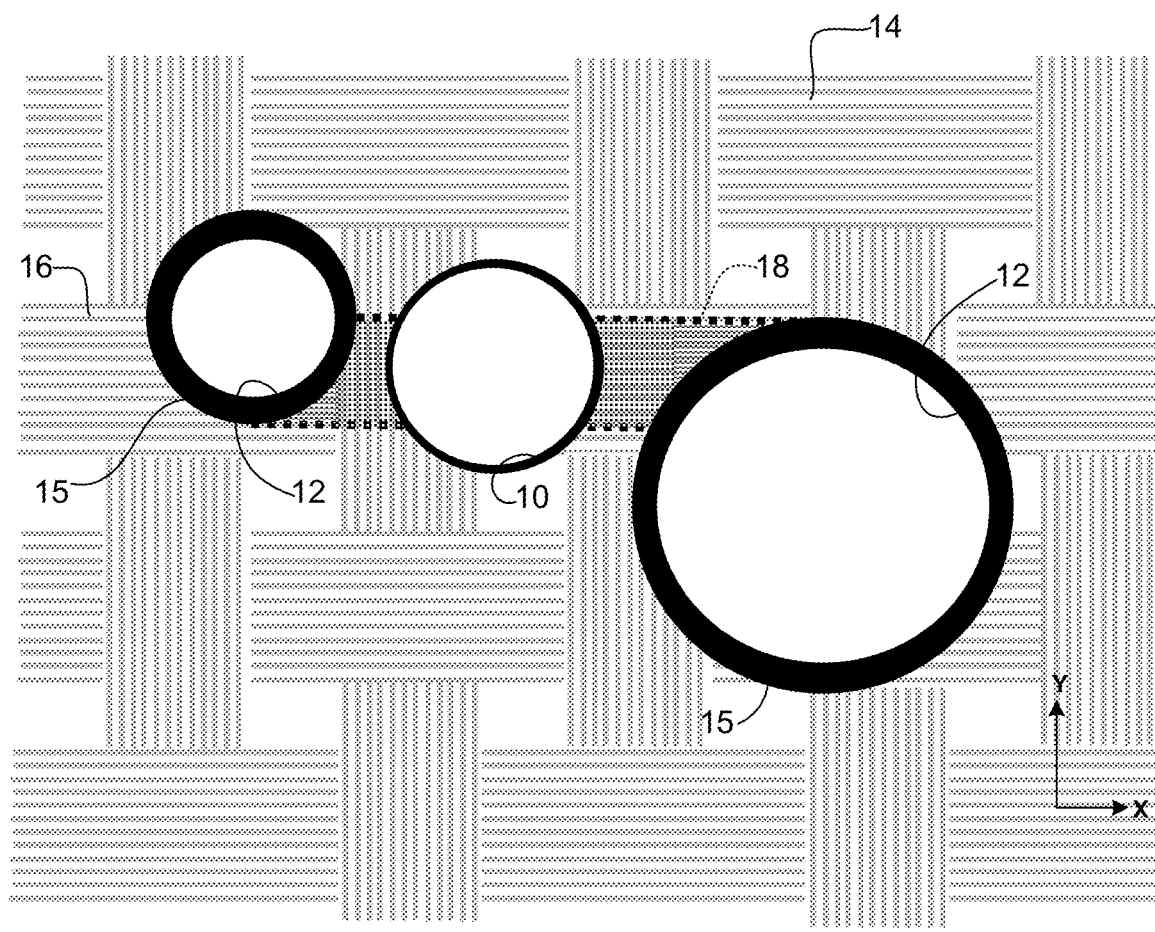
FIG. 1 is a schematic top view of a portion of a circuit board illustrating a CAF mitigation hole interposed between two plated holes, in accordance with one embodiment.

In one embodiment, an apparatus generally comprises a plurality of layers in a circuit board, each of the layers comprising a fiber weave, two plated holes extending through the layers and connecting two or more of the layers, and a non-plated hole extending through the layers and interposed between the plated holes. The non-plated hole passes through a potential CAF (Conductive Anodic Filament) migration path along the fiber weave to prevent CAF formation between the plated holes.

The non-plated hole may be positioned relative to a glass bundle extending along a single axis of the fiber weave. In one or more embodiments, the non-plated hole has a minimum diameter defined by a width between parallel lines, each of said parallel lines tangent to one of the plated holes and extending along one axis of the fiber weave. The minimum diameter of the non-plated hole may be increased to account for image rotation.

The plated holes may comprise a ground hole and a signal hole or a ground hole and a power hole. Pads for the plated holes may be clipped or removed.

In another embodiment, a circuit board generally comprises a plurality of layers, a plurality of plated holes extending through the layers, the plated holes comprising at least two adjacent plated holes having less than a minimum specified spacing therebetween, and a non-plated hole interposed between the adjacent plated holes. The non-plated hole is positioned to prevent CAF (Conductive Anodic Filament) formation between the adjacent plated holes.

In yet another embodiment, an apparatus generally comprises a plurality of layers in a circuit board, each of the layers comprising a fiber weave, two plated holes extending through the layers and connecting two or more of the layers, and a non-plated hole extending through the layers and interposed between the plated holes and filled with a non-conductive epoxy. The non-plated hole passes through a potential CAF (Conductive Anodic Filament) migration path along the fiber weave to prevent CAF formation between the plated holes.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

Typical PCB (Printed Circuit Board) substrates are constructed from various woven fiber fabrics strengthened and bound together with an epoxy resin. As the circuit density on circuit boards increases, copper features become more closely spaced and the risk of shorting increases. One example of a shorting failure mechanism is CAF (Conductive Anodic Filament), which may occur internal to the circuit board along an axis of the fiber at a fiber to resin interface. CAF involves the transport of conductive material across a nonmetallic substrate under the influence of an applied electric field and occurs between adjacent plated holes as copper migrates along the fiber and resin interface from anode to cathode. The copper migrates from a higher potential hole to a lower potential hole along the fibers. CAF may occur, for example, when a small filament of copper is formed under the presence of moisture and voltage, thereby shorting two adjacent copper features. CAF formation has become more of an issue with the increasing density of circuit boards and use of electronics for high reliability applications in harsh environments. CAF is a latent defect failure mode and typically occurs in the field after the PCB has been exposed to the environment under voltage bias. CAF failures may lead to intermittent electrical shorts, current leakage, and catastrophic failure modes in printed circuit boards, and may be difficult to detect.

Methods to address the issue of CAF failures may include, for example, increasing spacing between plated holes, increasing an angle between the holes, image rotation relative to the fiber weave, or the addition or removal of non-functional pads. In some cases, designs cannot be modified due to multiple constraints, thus adjusting the layout (spacing between holes, angle between holes, etc.) may not be possible. For example, tightly spaced connectors may have a footprint in which the spacing or angle of aligned holes cannot be adjusted.

The embodiments described herein prevent CAF failures without changing the location or orientation of plated holes or the distance between plated holes. As described in detail below, a non-plated hole (also referred to as a non-plated through-hole (thru-hole) or CAF mitigation hole) is created between closely spaced plated holes to eliminate a potential shorting path between the plated holes. Since the CAF mitigation holes are not plated, they do not affect signal integrity of nearby plated holes and can easily be incorporated into existing layouts.

The term Conductive Anodic Filament (CAF) migration, CAF path, CAF pathway, CAF failure, or CAF migration path along a fiber weave, as used herein may refer to any shorting defect mode including, for example, at a fiber to resin interface, within a hollow fiber (e.g., glass fiber), or along any foreign conductive material. The hollow glass fiber or foreign material may extend partially or the entire distance between the two plated holes.

The embodiments described herein may operate in the context of a data communications network including multiple network devices. The network may include any number of network devices in communication via any number of nodes (e.g., routers, switches, gateways, controllers, edge devices, access devices, aggregation devices, core nodes, intermediate nodes, or other network devices), which facilitate passage of data within the network. One or more of the network devices may comprise one or more circuit boards configured with one or more CAF mitigation holes, as described below. The network device may further include any combination of memory, processors, power supply units, and network interfaces.

Referring now to the drawings, and first to FIG. 1, a schematic top view of a non-plated hole (CAF mitigation hole, non-plated through-hole) 10 interposed between two plated holes (plated holes, plated through-holes, plated vias) 12 in a circuit board formed from layers of fiber weave 14 and resin is shown, in accordance with one embodiment. The term plated hole as used herein may refer to any diameter hole, including smaller diameter holes that may be referred to as vias. The larger plated hole 12 may be used, for example, for transmitting signal or power, and the smaller plated hole for ground. As described below, the non-plated hole 10 passes through a potential CAF (Conductive Anodic Filament) migration path 18 along the fiber weave 14 to prevent CAF formation between the plated holes 12.

The circuit board (e.g., printed circuit board, printed wire board, portion of a circuit board, printed board, circuit board panel, printed circuit board assembly) comprises multiple layers of conductive and nonconductive materials, with each layer defining a plane of the circuit board. One or more nonconductive layers may have a surface coated with a conductive material. Portions of the material may be removed to define conductive portions on the surface, which are referred to as traces. The traces define circuit paths on the circuit board that make an electrical connection between two or more points on the PCB. The layers typically include at least one signal plane, at least one ground plane, and at least one power plane. The plated holes 12 may interconnect traces on different PCB layers and connect layers to power or ground planes. Outermost layers (top and bottom) of the PCB may have components mounted on their surfaces.

The printed circuit board provides a dielectric material for copper or other conductive traces. The traces and pads are embedded within or deposited on the printed circuit board for connection with electronic components. Etching, deposition, bonding, or other processes may be used to form the traces, pads, or embedded components (e.g., passive or active devices). The printed circuit board may include one or more active devices (e.g., transistor, chip, processor, circuit, application specific integrated circuit, field programmable gate array, memory, etc.) and one or more passive devices (e.g., capacitor, resistor, inductor, connector, via, pad, etc.). The plated holes 12 are provided for routing traces through layers of the printed circuit board. The traces, pads, and electronic components may be arranged in any configuration to perform any number of functions (e.g., network server card, graphics card, motherboard, device card, and the like), or any other electronic part of a computer, router, switch, server, or other network device.

Typical PCB substrates are constructed from various woven fiber fabrics strengthened and bound together with epoxy resin. As shown in FIG. 1, fibers 16 (e.g., glass bundles) of the fiber weave extend generally along an x-axis and y-axis forming the woven fabric 14. The plated holes 12 may comprise, for example, signal holes, power holes, or ground holes, which are plated along their interior surfaces. The plated holes 12 may comprise, for example, a thin copper layer 15 (or any other conductive layer) on walls of the holes, providing them with electrical conductivity. The plating 15 may effectively cover the barrel of the hole and interconnect the various conductive layers.

The non-plated hole 10 and plated holes 12 may extend through the entire thickness of the circuit board (as described below with respect to FIG. 5) or a portion thereof. The holes 10, 12 may, for example, be created using a drilling process (e.g., any suitable procedure including, for example, standard through hole, optical alignment drilling, back-drilling, etc.).

The CAF mitigation hole 10 is a non-plated hole that is drilled between the two plated holes 12 in order to break a potential pathway 18 where a short may form. There is no copper plating on the walls of the non-plated hole 10, so that it has no electrical properties. The non-plated hole 10 is not used for mounting, but instead used to prevent CAF migration between the closely spaced plated holes 12. An example of a potential shorting path 18 between the two plated holes 12 is shown in FIG. 1. Since CAF typically runs along a single axis (e.g., x-axis, y-axis of FIG. 1), the risk becomes fully mitigated with drilling through the glass bundle 16 and severing the pathway 18. As described below with respect to FIG. 2, the CAF mitigation hole 10 is sized and positioned to break the potential shorting pathway 18 extending between the adjacent plated holes 12 and prevent CAF formation between the closely spaced plated holes.

Figure 2:
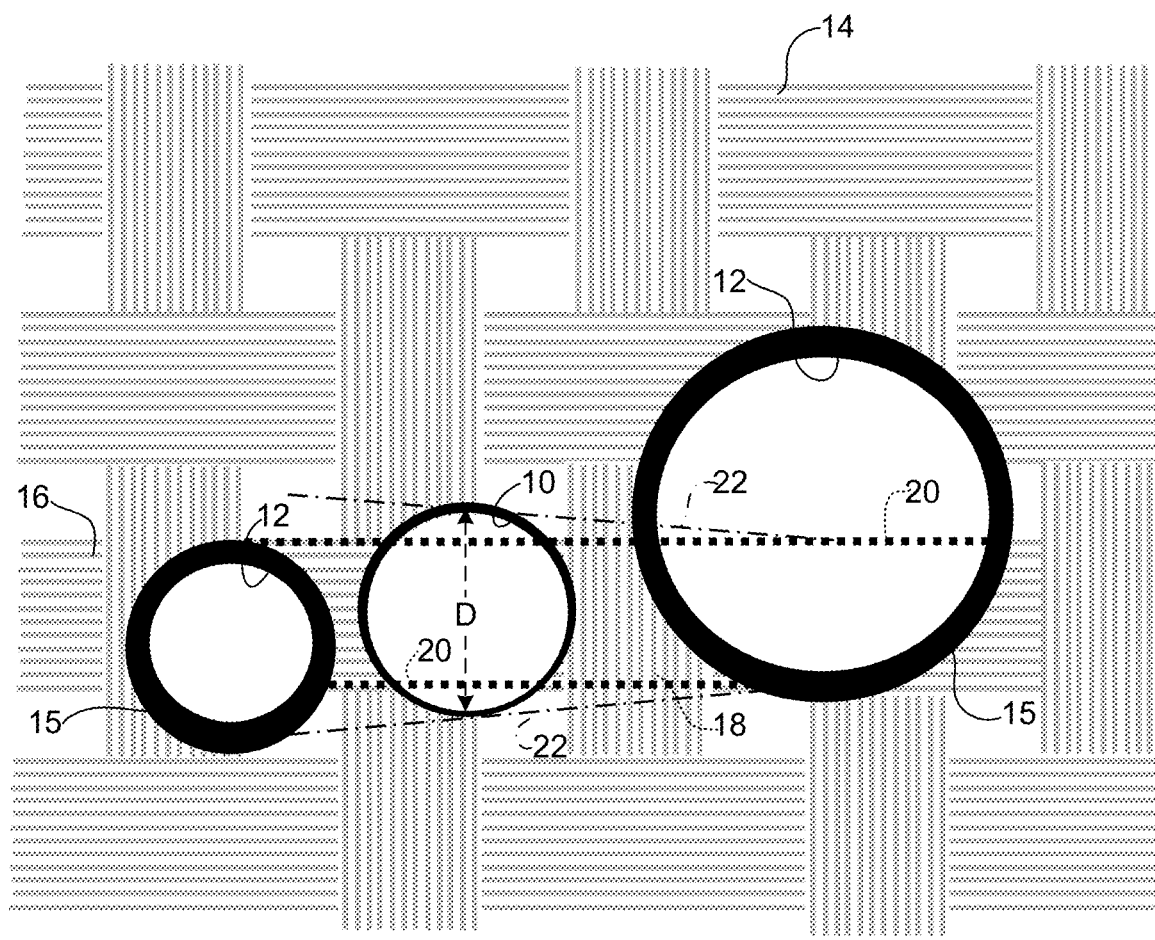
FIG. 2 is a schematic top view of the circuit board illustrating alignment of the CAF mitigation hole with the plated holes, in accordance with one embodiment.

FIG. 2 illustrates an example of alignment of the non-plated hole 10 relative to the plated holes 12 and fiber weave 14, in accordance with one embodiment. The fiber weave 14 may be formed, for example, from glass bundles comprising glass yarn. The non-plated hole 10 is positioned relative to one of the glass bundles 16 extending along a single axis of the fiber weave 14. As shown in FIG. 2, the non-plated hole 10 is positioned to extend through the glass bundle 16, thereby severing a CAF migration path 18 (defined by dashed lines 20). The non-plated hole 10 preferably has a minimum diameter (for complete CAF mitigation) defined by a width between parallel lines 20, each of the parallel lines tangent to one of the plated holes 12 and extending along one axis of the fiber weave 14. In the example shown in FIG. 2, a lower edge (as viewed in FIG. 2) of the pathway 18 is defined by a line 20 parallel to the glass bundle 16 and tangent to a drilled holewall of a first of the plated holes 12 (hole on the right in FIG. 2). An upper edge (as viewed in FIG. 2) of the pathway 18 is defined by another line 20 parallel to the glass bundle 16 and tangent to a drilled holewall of a second of the plated holes 12 (hole on the left in FIG. 2).

In one or more embodiments, a diameter D of the non-plated hole 10 corresponds to a width of the migration path 18 plus a margin to account for manufacturing tolerances. For example, the minimum diameter of the non-plated hole 10 may be increased or target location of the hole adjusted to account for image rotation (i.e., circuitry pattern relative to the fiber weave). In the example shown in FIG. 2, the diameter D of the non-plated hole 10 is increased to intersect angled phantom lines 22 in FIG. 2 to account for image rotation (e.g., 5 degrees, 8 degrees, or any other angle from the axis). Placement and size of the non-plated hole 10 may also take into account any drill mis-registration (deflection) (e.g., about 4.5 mils or any other tolerance value).

It is to be understood that the minimum diameter described above for the non-plated hole is only an example. In one or more embodiments, the diameter of the non-plated hole may be smaller, with the non-plated hole not covering the entire CAF path, in which case the risk of CAF migration between the plated holes would not be fully mitigated, but may be significantly reduced based on how much of the fiber weave is removed along a single axis.

Figure 3:
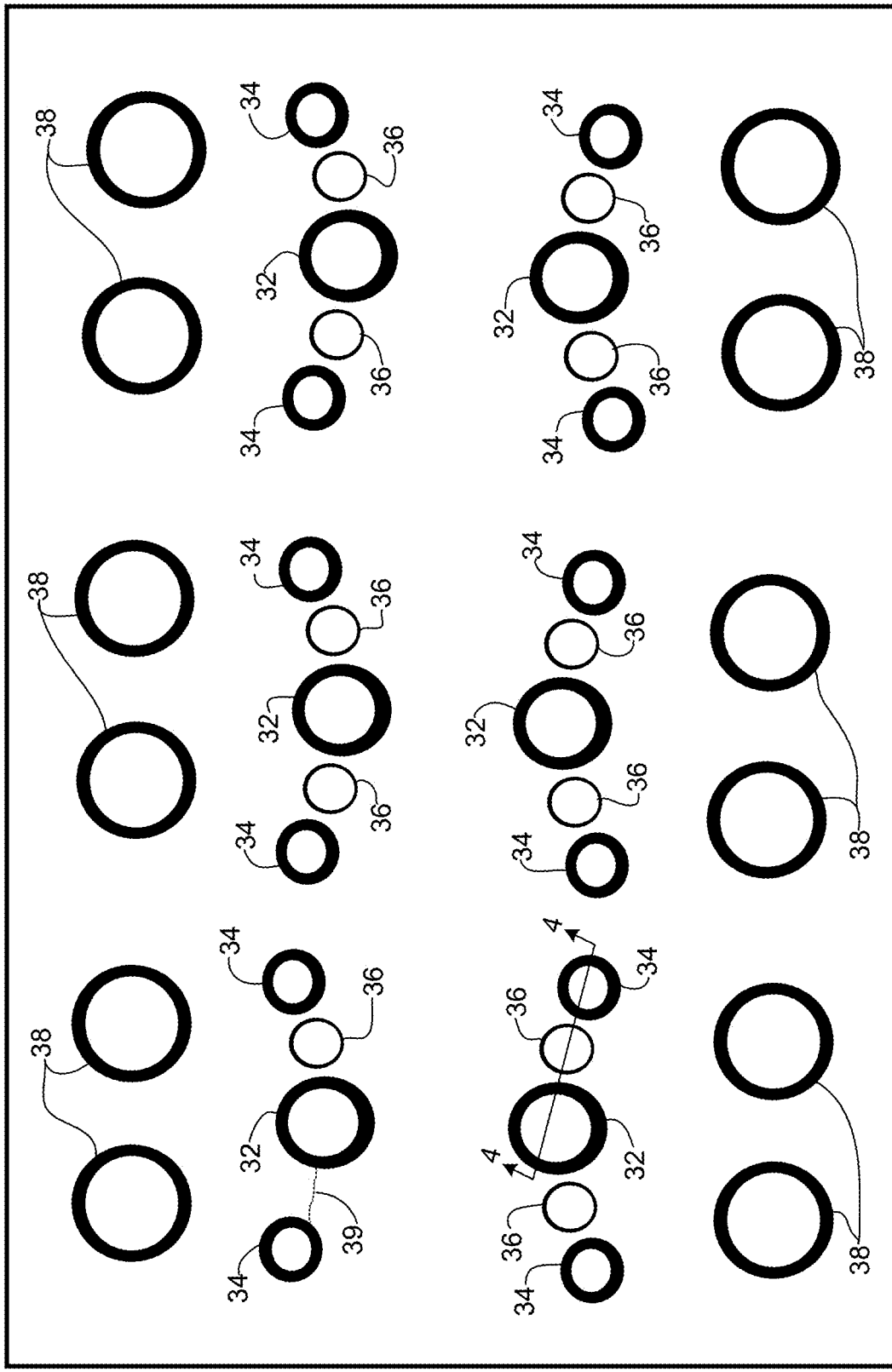
FIG. 3 is a schematic top view of a circuit board illustrating a plurality of CAF mitigation holes interposed between plated holes and CAF formation in a location without a CAF mitigation hole.

FIG. 3 is a top view of a circuit board 30 comprising a plurality of plated holes (signal holes 32, ground holes 34, power holes 38) and a plurality of non-plated holes (CAF mitigation holes) 36 interposed between the closely spaced signal holes 32 and ground holes 34. In the example shown in FIG. 3, the power holes 38 are spaced apart a sufficient distance (i.e., greater than a specified minimum spacing) from the ground holes 34, so that there is no need for a CAF mitigation hole. For illustration purposes, one of the CAF mitigation holes 36 has been left off in the upper left corner in FIG. 3 to show the formation of CAF 39 between two adjacent plated holes 32, 34.

Figure 4:
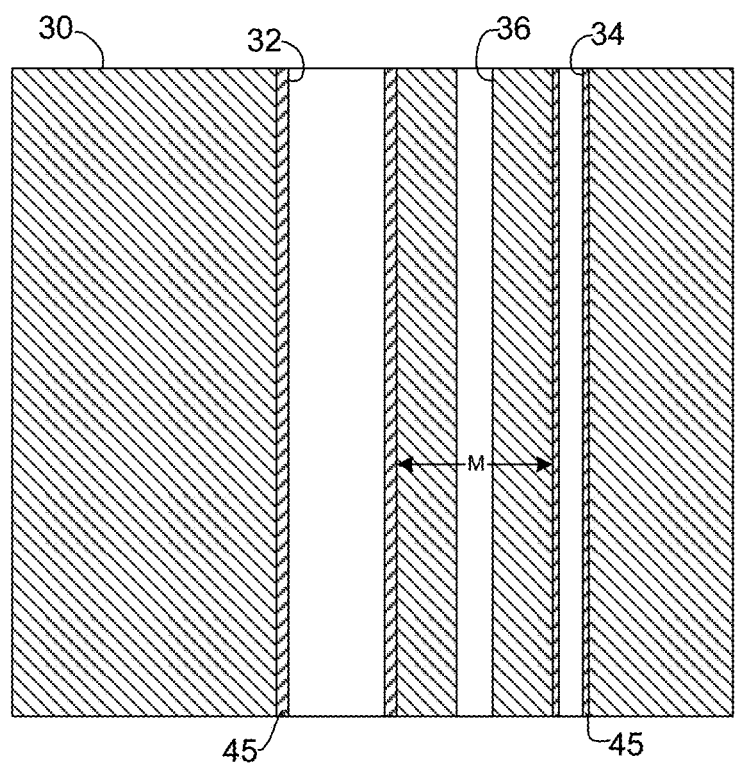
FIG. 4 is a schematic cross-sectional partial view taken through line 4-4 in FIG. 3.

FIG. 4 is a schematic cross-sectional partial view taken through line 4-4 in FIG. 3. For simplification, the upper and lower portions of the circuit board and individual layers are not shown. The signal hole 32 and ground hole 34 each include a plating layer 45. The CAF mitigation hole (non-plated hole) 36 is interposed between the two adjacent plated holes 32, 34 having spacing M therebetween, which is less than a minimum specified spacing. A minimum specified spacing between plated holes with different potential (e.g., power/ground, signal/ground) may be defined based on PCB guidelines, and may be, for example, 17 mils, or any other minimum specified distance.

Figure 5:
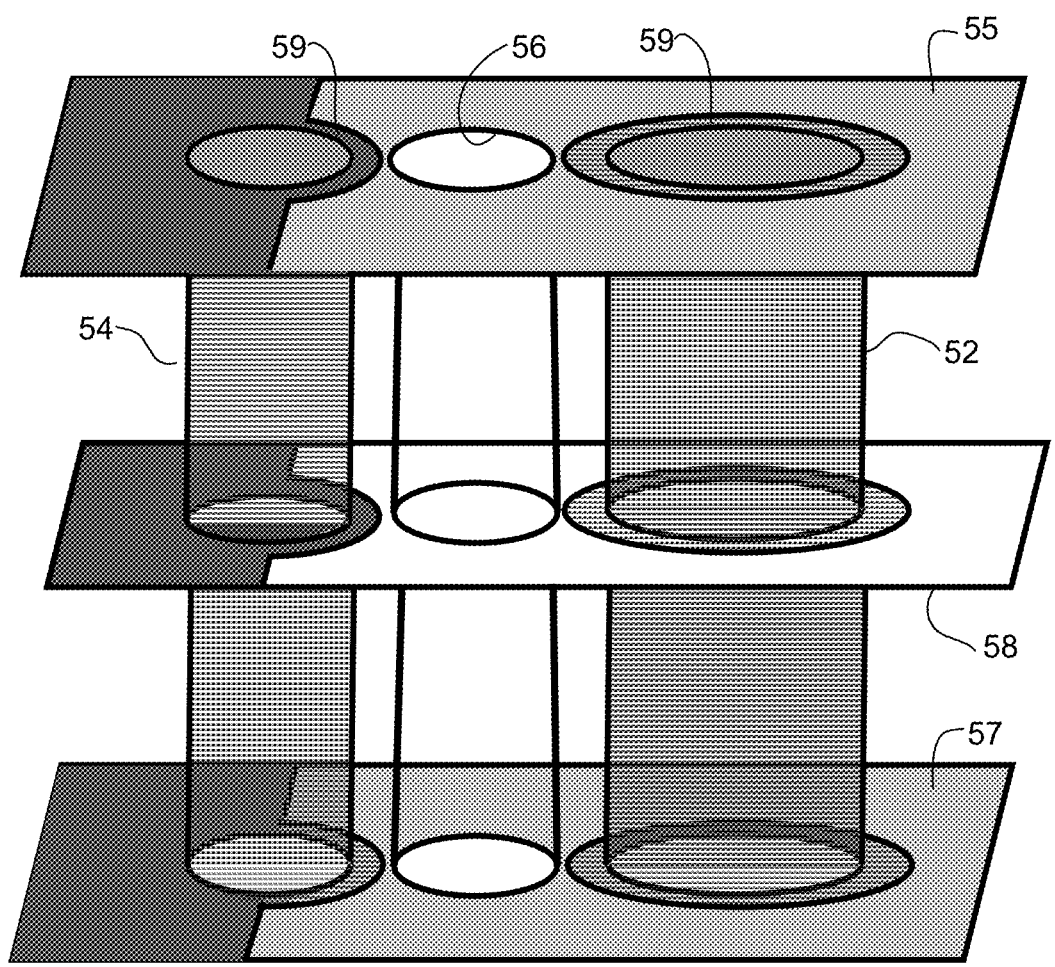
FIG. 5 is a schematic perspective of the CAF mitigation hole and the plated holes passing through layers in the circuit board, in accordance with one embodiment.

FIG. 5 is a schematic perspective of a signal hole 52, ground hole 54, and non-plated CAF mitigation hole 56 interposed between the two plated holes, in accordance with one embodiment. For clarity, at least some insulating material and layers have been removed. The circuit board comprises a plurality of layers 55, 57, 58, each of the layers comprising a fiber weave (as previously described with respect to FIGS. 1 and 2), two adjacent closely spaced plated holes 52, 54 extending through the layers and connecting two or more of the layers, and a non-plated hole 56 interposed between the two plated holes. Annular rings (pads) 59 are shown at interfaces between the plated holes 52, 54 and layers 55, 57, 58. The pads 59 may be clipped or removed to allow for ease of drilling in tight areas. Signal holes may be back-drilled to partially remove some amount of plating.

In the example shown in FIG. 5, the holes 52, 54, 56 extend from the top layer 55 to the bottom layer 57, through any number of inner layers 58. The holes 52, 54, 56 may also be configured to extend through only a portion of the layers (i.e., not extend through one or more additional layers at an upper or lower portion of the circuit board). The non-plated hole 56 extends through the same layers through which the plated holes 52, 54 pass through to prevent CAF migration in each layer.

Figure 6:
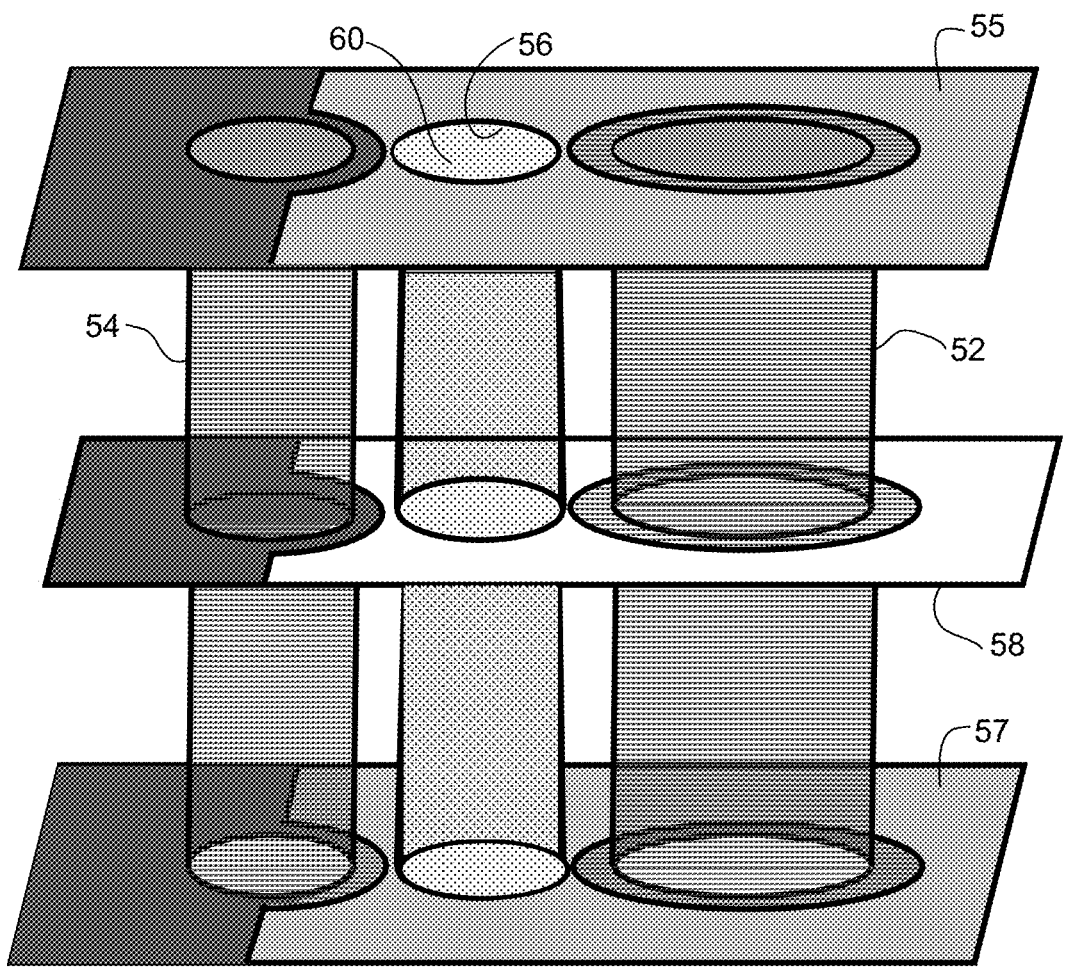
FIG. 6 is a schematic perspective of the CAF mitigation hole shown in FIG. 5 filled with an epoxy.

FIG. 6 illustrates an epoxy (non-conductive epoxy-fill) 60 added to the CAF mitigation hole 56 to prevent any exposed signal or ground hole interlayers since holes are in close proximity. Epoxy 60 in the non-plated hole 56 may be used to add rigidity for connector insertions in nearby signal hole and prevent shorting potential if there are exposed copper inner layers in the hole. The non-plated hole 56 may or may not be filled at the same time as other holes in the circuit board are filled. The ground hole may also be epoxy filled.

It is to be understood that the arrangement of holes shown in FIGS. 1-6 and described herein are only examples and other arrangements, sizes, spacing, alignment, layouts, or number of holes or holes may be used, without departing from the scope of the embodiments. As is well known by those skilled in the art, the circuit board may contain any number of signal, power, or ground holes (vias) connected to any number of traces.

As previously noted, the layout and placement of the CAF mitigation holes preferably take into account possible image rotation or drill mis-registration (deflection) during manufacturing. The CAF mitigation holes may be formed using various manufacturing processes such as standard through-via or optical alignment drilling, flip drill or standard drill, or varying target location of CAF mitigation hole relative to signal and ground holes. The CAF mitigation holes may be drilled or epoxy filled (if used) before or after signal and ground holes. The CAF mitigation holes may be used with ground holes that have clipped or removed outer layer (O/L) and/or inner layer (I/L) pads. Also, the spacing between the CAF mitigation hole and the two plated holes may vary (e.g., CAF mitigation hole may be positioned closer to one of the plated holes or may be evenly spaced between the two plated holes).

As can be observed from the foregoing, one or more embodiments described herein provide advantages over conventional systems. For example, a non-plated hole drilled between existing tightly-spaced plated holes prevents CAF formation between the plated holes. Since CAF mitigation holes are non-plated, they do not affect signal integrity of nearby plated holes and can be easily added to existing layouts with little or no adjustment to the layout.

Although the apparatus has been described in accordance with the embodiments shown, one of ordinary skill in the art will readily recognize that there could be variations made without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   a plurality of layers in a circuit board, each of said layers comprising a fiber weave;
   two plated holes extending through said layers and connecting two or more of said layers; and
   a non-plated hole extending through said layers and interposed between the plated holes;

wherein the non-plated hole passes through a potential CAF (Conductive Anodic Filament) migration path along the fiber weave to prevent CAF formation between the plated holes; and wherein the non-plated hole is positioned relative to a glass bundle extending along a single axis of the fiber weave and has a minimum diameter defined by a width between parallel lines, each of said parallel lines tangent to one of the plated holes and extending along one axis of the fiber weave.

2. The apparatus of claim 1 wherein the plated holes comprise a ground hole and a signal hole.

3. The apparatus of claim 1 wherein the plated holes comprise a ground hole and a power hole.

4. The apparatus of claim 1 wherein said minimum diameter of the non-plated hole is increased to account for image rotation.

5. The apparatus of claim 1 wherein a pad of at least one of the plated holes is removed or clipped.

6. A circuit board comprising:
a plurality of layers;
a plurality of plated holes extending through said layers, said plurality of plated holes comprising at least two adjacent plated holes having less than a minimum specified spacing therebetween; and
a non-plated hole extending through said layers and interposed between said adjacent plated holes;
wherein the non-plated hole is positioned to prevent CAF (Conductive Anodic
Filament) formation between said adjacent plated holes; and
wherein the non-plated hole is positioned relative to a glass bundle extending along a single axis
and has a minimum diameter defined by a width between parallel lines, each of said parallel lines tangent to one of the plated holes.

7. The circuit board of claim 6 wherein the non-plated hole passes through a potential CAF migration path along fiber weaves of said plurality of layers.

8. The circuit board of claim 6 wherein said two adjacent plated holes comprise a ground hole and a signal hole.

9. The circuit board of claim 6 wherein said two adjacent plated holes comprise a ground hole and a power hole.

10. The circuit board of claim 6 wherein the non-plated hole is filled with a non-conductive epoxy.

11. The circuit board of claim 6 wherein a diameter of the non-plated hole is sized to account for image rotation.

12. The circuit board of claim 6 wherein a pad of at least one of the plated holes is removed or clipped.

13. An apparatus comprising:
a plurality of layers in a circuit board, each of said layers comprising a fiber weave;
two plated holes extending through said layers and connecting two or more of said layers; and
a non-plated hole interposed between the plated holes and filled with a non-conductive epoxy;
wherein the non-plated hole passes through a potential CAF (Conductive Anodic Filament) migration path along the fiber weave to prevent CAF formation between the plated holes; and
wherein the non-plated hole is positioned relative to a glass bundle extending along a single axis of the fiber weave
and has a minimum diameter defined by a width between parallel lines, each of said parallel lines tangent to one of the plated holes and extending along one axis of the fiber weave.

14. The apparatus of claim 13 wherein the plated holes comprise a ground hole and a signal hole.

15. The apparatus of claim 13 wherein the plated holes comprise a ground hole and a power hole.

16. The apparatus of claim 13 wherein said minimum diameter of the non-plated hole is increased to account for image rotation.

17. The apparatus of claim 13 wherein a pad of at least one of the plated holes is removed or clipped.

* * * * *